US008493150B2

(12) United States Patent
Mazet et al.

(10) Patent No.: US 8,493,150 B2
(45) Date of Patent: Jul. 23, 2013

(54) CLASS-AB OUTPUT STAGE

(75) Inventors: Roland Mazet, Claix (FR); Christophe Forel, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 13/275,117

(22) Filed: Oct. 17, 2011

(65) Prior Publication Data

US 2012/0092071 A1    Apr. 19, 2012

(30) Foreign Application Priority Data

Oct. 18, 2010  (FR) ..................................... 10 58475

(51) Int. Cl.
*H03F 3/45* (2006.01)
(52) U.S. Cl.
USPC .......................................... 330/255; 330/261
(58) Field of Classification Search
USPC .......................................... 330/253, 255, 261
See application file for complete search history.

(56) References Cited

U.S. PATENT DOCUMENTS

| 5,311,145 | A * | 5/1994 | Huijsing et al. | 330/255 |
|---|---|---|---|---|
| 6,657,495 | B2 * | 12/2003 | Ivanov et al. | 330/255 |
| 7,330,074 | B2 * | 2/2008 | Kang et al. | 330/255 |
| 2005/0225392 | A1 | 10/2005 | Ivanov | |

OTHER PUBLICATIONS

Aliahmad, M. et al., "Integration of a Short-Loop SLIC in a Low-Voltage Submicron BiCMOS Technology," IEEE Journal of Solid-State Circuits 33(6):850-858, Jun. 1998.
Hogervorst, R. et al., "A Compact Power-Efficient 3 V CMOS Rail-to-Rail Input/Output Operational Amplifier for VLSI Cell Libraries," IEEE Journal of Solid-State Circuits 29(12):1505-1513, Dec. 1994.
Ishida, K. et al., "An Outside-Rail Opamp Design Relaxing Low-Voltage Constraint on Future Scaled Transistors," IEICE Trans. Electron. E90-C(4):786-792, Apr. 2007.

* cited by examiner

*Primary Examiner* — Khanh V Nguyen
(74) *Attorney, Agent, or Firm* — Seed IP Law Group PLLC

(57) ABSTRACT

An output stage of a class-AB amplifier, including: a first transistor of a first channel type between a first terminal of application of a first voltage and an output terminal of the stage, having its gate connected to a first input terminal of the stage; a first transistor of a second channel type between this output terminal and a second terminal of application of the first voltage, having its gate connected to a second input terminal of the stage; and second and third transistors of the second channel type between the output terminal and the first transistor of the second channel type, the gate of the second transistor being connected to the midpoint of a resistive dividing bridge between said output terminal and the gate of the third transistor of the second channel type, and the gate of the third transistor being biased to a fixed voltage.

22 Claims, 4 Drawing Sheets

CLASS-AB OUTPUT STAGE

BACKGROUND

1. Technical Field

The present disclosure generally relates to electronic circuits and, more specifically, to so-called class-AB amplifiers.

The present disclosure more specifically applies to audio or audio/video signal processing chains.

2. Description of the Related Art

In most audio or audio/video devices, signals received by an antenna, extracted from a tape, from a CD/DVD, from a mobile telephony network, etc. are, possibly after reprocessing, amplified to be exploited by a playback device (television set, home cinema, cell phone, etc.) equipped with a decoder. Most often, such signals transit from one device to another or within a device, in compliance with the levels provided by standards. For example, for audio signals, a DOLBY standard sets the maximum excursion of audio signals to 2 volts RMS (approximately 5.6 volts peak to peak).

FIG. 1 is a simplified representation of a processing chain of the type to which the present disclosure applies as an example. In this example, audio signals originating from an antenna 11, from a video tape 12, or from a digital system 13, are processed by one or several circuits 2 (AUDIO PROC.) before being amplified (block 3, AMP.) to be provided, for example, to a scart connector 4. The processing (demodulation, filtering, path separation, etc.) performed by circuits 2 is different according to the audio source, but the signal(s) provided by the circuit must all be amplified, for example, to respect the DOLBY standard at the output. Other audio or video signals reach scart connector 4 (arrow in dotted lines 15). Such signals originate from parallel processing paths. In particular, for stereo signals, left-hand and right-hand paths are amplified separately (while possibly sharing a same upstream circuit 2).

Processing and amplification functions 2 and 3 are generally carried out by circuits powered under different voltages $V_1$ and $V_2$ ($V_2$ being greater than $V_1$) and made in different technologies, that is, with transistors capable of withstanding different voltages. Taking the example of the DOLBY standard, voltage $V_2$ is on the order of 8 volts while the processing circuits are powered under a lower voltage $V_1$, for example, on the order of 3.3 volts. For simplification, reference will be made hereafter to high and low voltages, but these voltages keep the same order of magnitude (there is no switching from a low voltage of a few volts to a high voltage of some hundred volts).

Further, although reference will be made in the following description to the provision of audio or video signals by a scart connector, the present disclosure more generally relates to any transmission of audio signals from one circuit to another or from one circuit portion to another in which similar problems are posed.

It would be desirable to be able to integrate the entire processing chain in a same integrated circuit. However, making this circuit in the technology adapted to the highest voltage adversely affects the bulk and generates an unnecessary consumption in the processing portion.

It would thus be desirable to make the amplifier in the low-voltage technology. Another problem then arises, which is that the transistors of this low-voltage technology do not stand the high voltage used to provide the amplified signal with the desired output deviation.

BRIEF SUMMARY

An embodiment of the present disclosure provides a class-AB amplifier, and more specifically an output stage of such an amplifier, in a technology having transistors standing a lower voltage than the amplifier power supply voltage.

Another embodiment of the present disclosure provides a signal processing and amplification chain capable of being integrated in a transistor technology only standing a voltage lower than a power supply voltage of the amplifier output stage.

Another embodiment of the present disclosure provides a solution more specifically capable of forming a class-AB amplifier complying with the DOLBY standard.

An embodiment provides an output stage of a class-AB amplifier integrated in a technology adapted to a first voltage and intended to be powered under a second voltage greater than the first one, comprising:

at least one first transistor of a first channel type between a first terminal of application of the second voltage and an output terminal of the stage, having its gate connected to a first input terminal of the stage;

at least one first transistor of a second channel type between this output terminal and a second terminal of application of the second voltage, having its gate connected to a second input terminal of the stage; and at least one second and one third transistors of the second channel type in series between the output terminal and the first transistor of the second channel type, the gate of the second transistor being connected to the midpoint of a resistive dividing bridge between said output terminal and the gate of the third transistor of the second channel type, and the gate of the third transistor being biased to a fixed voltage.

According to an embodiment, the gate of the second transistor of the second channel type is connected to the junction point of a first current source and of two diode-assembled transistors of the second channel type.

According to an embodiment, said first transistor of the first channel type is a DRIFT-type transistor.

According to an embodiment, at least one second and one third transistors of the first channel type are in series between the output terminal and said first transistor of the first channel type, the gate of the second transistor of the first channel type being connected to the midpoint of a resistive dividing bridge between said output terminal and the gate of the third transistor of the first channel type, and the gate of this third transistor being biased to a fixed voltage.

According to an embodiment, the gate of the third transistor of the first channel type is connected to the junction point of two diode-assembled transistors of the first channel type and of a second current source.

According to an embodiment, the respective gates of the first transistors of the first and second channel types are respectively connected between a current source and a differential stage formed of two transistors in parallel respectively of the first channel type and of the second channel type having their respective gates connected to the first and second current sources.

An embodiment also provides a class-AB amplifier comprising an output stage.

An embodiment also provides an audio signal processing chain comprising, for each path, a class-AB amplifier.

The foregoing and other features and advantages will be discussed in detail in the following non-limiting description of specific embodiments in connection with the accompanying drawings.

DETAILED DESCRIPTION

Figure 1:
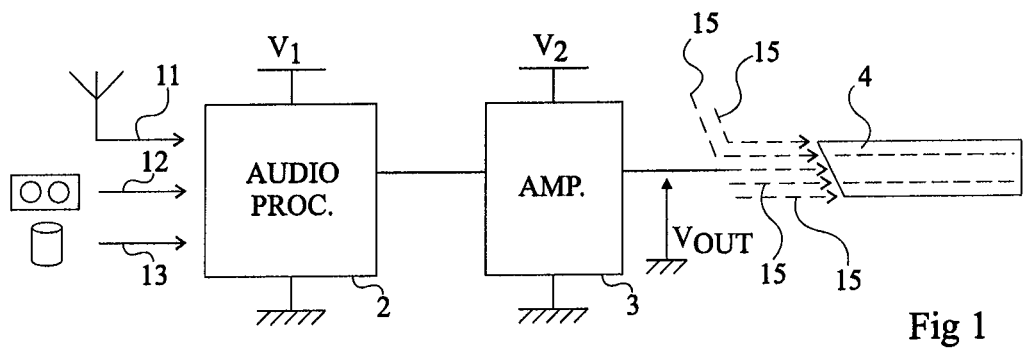
FIG. 1, previously described, schematically shows in the form of blocks an example of an audio signal processing chain of the type to which the present disclosure applies as an example.

The same elements have been designated with the same reference numerals in the different drawings. For clarity, only those elements which are useful to the understanding of the present disclosure have been shown and will be described. In particular, the origin and the destination of the signals processed by the amplifier which will be described have not been detailed, the present disclosure being compatible with any usual application of a class-AB amplifier.

An embodiment will be described in relation with an example of application to the processing of an analog audio signal. It however more generally applies to any amplifier which is desired to be formed in a finer technology (having transistors standing a lower voltage) than that used for the output signal amplitude.

Figure 2:
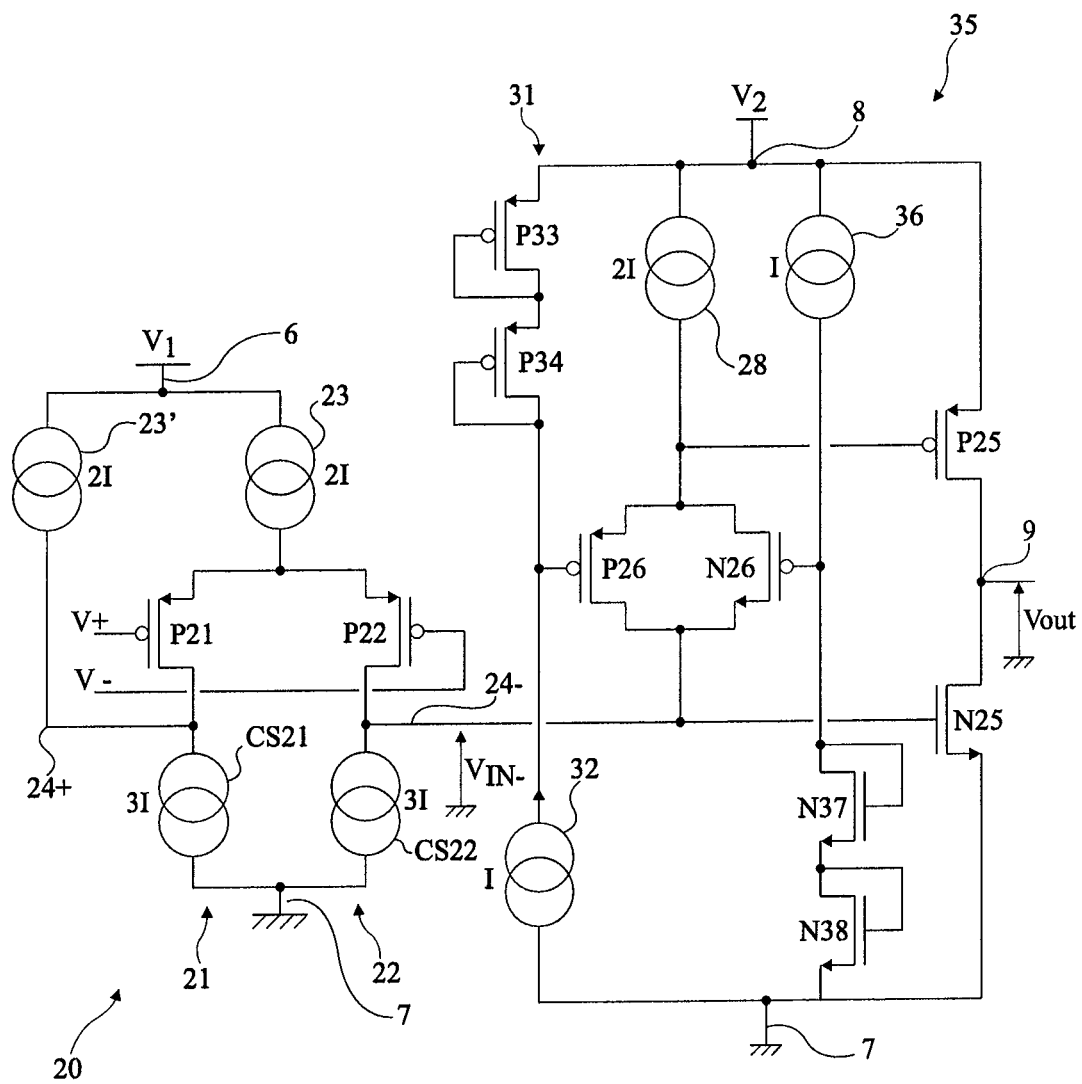
FIG. 2 shows an example of a usual class-AB amplifier diagram.

FIG. 2 shows a simplified diagram of an example of a usual class-AB amplifier.

In this example, an input stage based on P-channel transistors is assumed.

Differential input stage 20 comprises, in parallel between a current source 23 connected to a first terminal 6 of application of a power supply voltage V1 (positive) and ground 7, two branches 21 and 22, each comprising a P-channel MOS transistor in series with a current source CS21, CS22. The respective gates of transistors P21 and P22 define differential inputs V− and V+ of the amplifier input stage. The drains of transistors P21 and P22 define output terminals 24− and 24+ of the input stage. Terminal 24+ is connected to terminal 6 by a current source 23'. Terminal 24− is connected to an input terminal of an output stage 25 or amplification stage of the amplifier.

The embodiments which will be described relate to a class-AB amplifier output stage. Such a stage is capable of receiving a signal to be amplified originating from any type of input stage, the stage described in relation with FIG. 2 being an example only. Output stage 25 which will be described may indeed operate by receiving a signal to be amplified (a common-mode voltage $V_{IN+}$ or $V_{IN-}$) on one or the other of its input terminals.

The diagram of the output stage of FIG. 2 is known as a Monticelli diagram.

This output stage comprises two MOS transistors P25 and N25, respectively with a P channel and with an N channel, in series between two terminals 8 and 7 of application of a power supply voltage $V_2$ greater than voltage $V_1$. The junction point of transistors P25 and N25 defines an output terminal 9 of the amplifier providing a signal $V_{OUT}$. In the example of FIG. 2, the gate of transistor P25 is connected to input terminal 24−.

Stage 25 comprises, in parallel between terminals 8 and 7, two branches 31 and 35, each comprising, in series, two MOS transistors and a current source. Branch 31 comprises two P-channel MOS transistors, P33 and P34, both diode-assembled (drain and gate interconnected) and a current source 32. Branch 35 comprises a current source 36 and two diode-assembled N-channel transistors, N37 and N38 (drain and gate interconnected).

The respective junction points of the pairs of transistors of each branch and of the corresponding junction source (drain of transistor P34, drain of transistor N37) are connected to the respective gates of MOS transistors P26 and N26, respectively having a P channel and an N channel. Transistors P26 and N26 are connected in parallel and, on both sides, connected by current sources 28 and 29 to terminals 8 and 7. Finally, transistors P26 and N26 interconnect the gates of transistors P25 and N25. The current sources are sized so that sources 32 and 36 provide or absorb a constant current I and that sources 28 and 29 provide or absorb a double current 2I.

On the side of input stage 20, current sources 23 and 23' provide or absorb a current 2I and current sources CS21 and CS22 provide or absorb a current 3I.

The operation of a Monticelli-type output stage is known and will be shortly reminded hereinafter.

On the P-channel transistor side (or high portion of the stage), the gate-source voltage drops of transistors P25 and P26 are compensated by those of transistors P33 and P34. Similarly, on the side of transistor N, the gate-source voltage drops of transistors N25 and N26 are compensated by those of transistors N37 and N38. The quiescent current of the amplifier (current in the branch of transistors P25 and N25) is set by the sizing of current sources 28, 29, 32, and 36 and by the surface area ratio between transistors P25, P26 and transistors P33, P34 on the one hand, and by the surface area ratio between transistors N25, N26 and transistors N37, N38 on the other hand. For example, if all surface area ratios are equal, the quiescent current is equal to current I provided by current sources 32 and 36. An imbalance caused by the application of a signal $V_{IN-}$ on the gate of transistor N25 is amplified on terminal 9.

Figure 3:
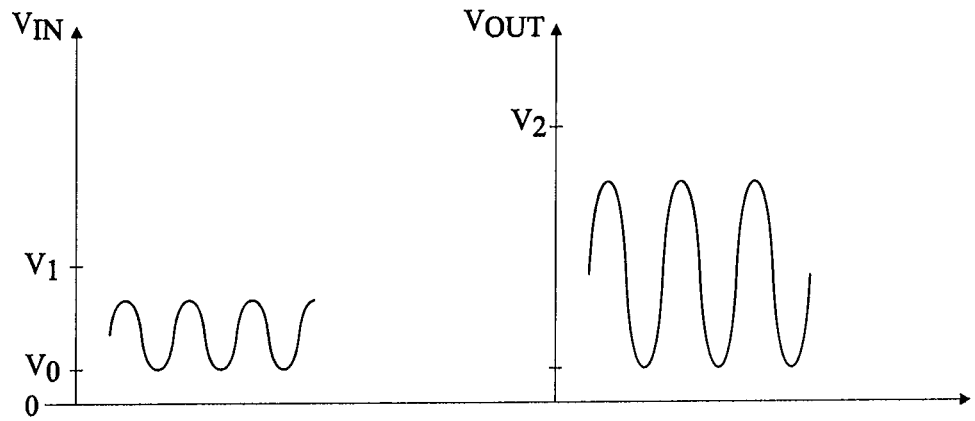
FIG. 3 illustrates the desired amplification function.

FIG. 3 illustrates the operation of output stage 25 of FIG. 2A. Input stage 20 is assumed to provide a sinusoidal signal $V_{IN-}$ between a level $V_0$ and level $V_1$ (minus the voltage drop in current source 23 and the gate-source voltage of transistor P21). Level $V_0$ corresponds to the gate-source voltage of transistor N24, plus the gate-source voltage of transistor P21 and minus the drain-source voltage of transistor P21 when saturated. Signal $V_{IN-}$ is amplified by stage 25 which provides a sinusoidal signal $V_{OUT}$ between level $V_0$ and a level slightly lower than level $V_2$ (voltage drop in transistor P25).

To integrate such an amplifier, the usual solution is to use a technology adapted to the highest voltage $V_2$. Stages 20 and 25 are then made in this technology while being powered by different voltages.

Integrating the amplifier with the upstream circuits (processing circuit 2, FIG. 1) by using the technology adapted to voltage $V_2$ results in a significant bulk and increases the consumption.

Conversely, the embodiments which will be described adapt the amplifier output stage so that it can be made in a technology adapted to voltage $V_1$, while being powered with a greater voltage $V_2$.

To simplify the following description, reference will no longer be made to the circuits present upstream of the amplifier, and input stage 20 will be considered as symbolizing these upstream circuits. Indeed, this input stage is, like the upstream circuits, powered with the lower-level voltage. In reality, the input stage is part of the amplifier.

Figure 4:
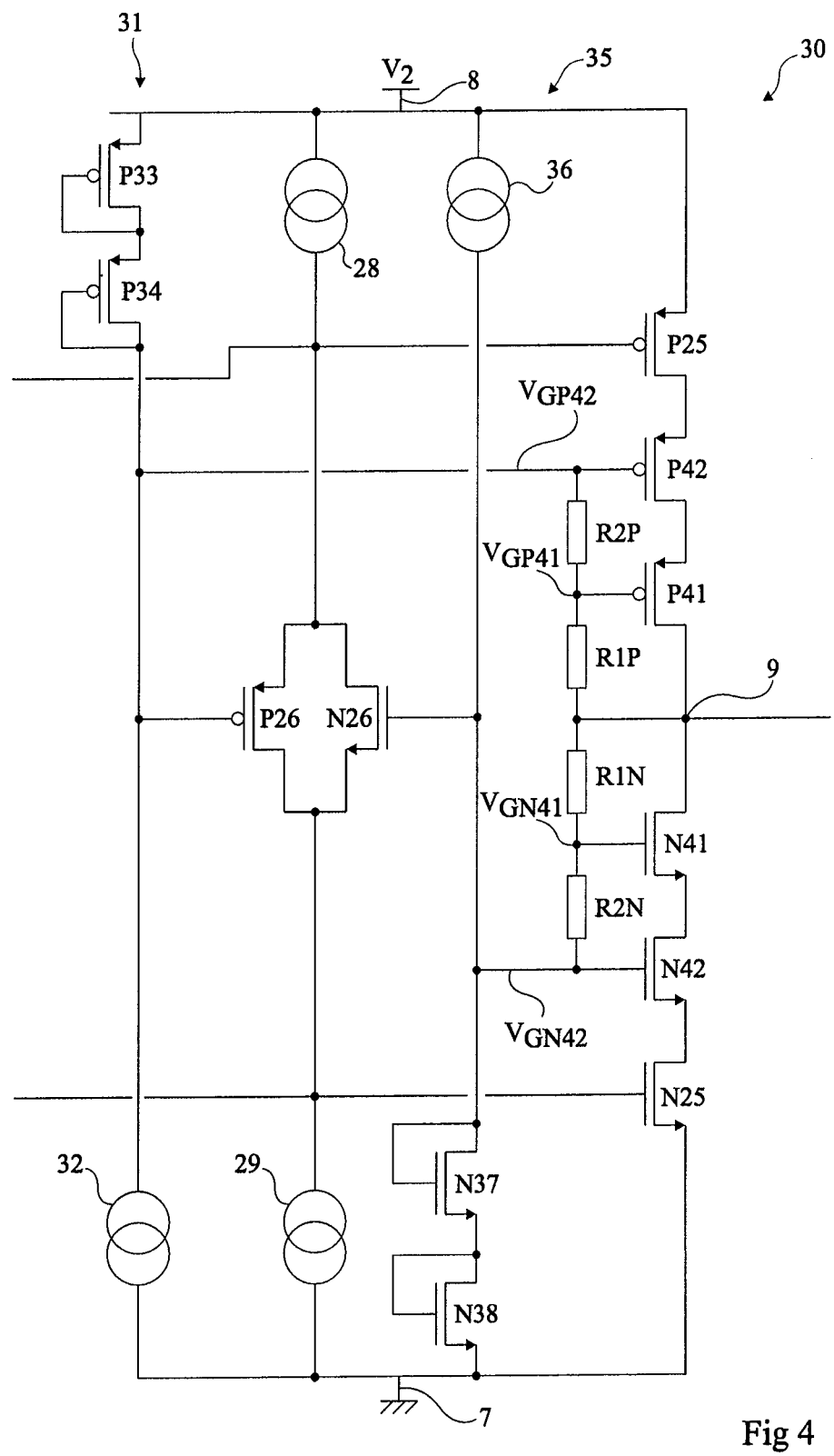
FIG. 4 shows an embodiment of an output stage of a class-AB amplifier.

FIG. 4 shows an embodiment of an output stage 30 of an amplifier 3 intended to be powered with a voltage $V_2$ while being made in a technology adapted to a lower voltage $V_1$. For example, voltage $V_1$ is on the order of 3.3 volts and voltage $V_2$ is on the order of 8 volts.

The amplifier input stage is not illustrated in FIG. 4. This stage is not modified with respect to usual input stages.

On the output stage side, the electric diagram is modified to be able to form all transistors in the technology adapted to voltage $V_1$. For this purpose, it is provided that none of the transistors sees between its terminals a voltage greater than the voltage acceptable for the technology, in particular when output terminal 9 is at the maximum level for the N-channel MOS transistors of the low portion and when the output voltage is at the minimum level for the P-channel transistors of the high portion.

As in FIG. 2, the drawing shows the pair of transistors P26 and N26 between current sources 28 and 29 and branches 31 and 35.

On the output branch side, three N-channel MOS transistors N41, N42, and N25, in series, are provided in the low portion (between terminal 9 and terminal 7). In the high portion (between terminal 8 of application of voltage $V_2$ and terminal 9), three P-channel MOS transistors P41, P42, and P25 are series-connected.

The gates of transistors N42 and P42 are respectively connected to the drains of transistors N37 and P34 of branches 31 and 35. As a result, transistors N25 and P25 only see a gate-source voltage between their terminals (between their drain and source). Advantage is taken for this purpose from the presence of diode-assembled associations of transistors N37 and N38, respectively P33 and P34. Gate-source voltages $V_{GS}$ (for example, approximately 0.5 volt) are set by current sources 36 and 32 which set the voltages across the series associations of transistors N37 and N38, respectively P33 and P34. Voltage $V_{GN42}$ of the gate of transistor N42 thus corresponds to two gate-source voltages $V_{GSN}$ of N-channel transistors. Voltage $V_{GP42}$ of the gate of transistor P42 corresponds to two gate-source voltages $V_{GSP}$ of P-channel transistors.

To limit the voltage across transistors N41 and P41, resistive dividing bridges (resistors R1N and R2N in series in the low portion and resistors R1P and R2P in series in the high portion, in series) are respectively connected between terminal 9 and the gate of transistor N42, and between terminal 9 and the gate of transistor P42. The respective midpoints of these dividing bridges are connected to the gates of transistors N41 and P41. The resistance values will be selected to set voltages $V_{GN41}$ of the gate of transistor N41 and $V_{GP41}$ of the gate of transistor P41, and thus the drain-source voltages of transistors N41 and N42 in the low portion and of transistors P41 and P42 in the high portion. Resistors R1N, R2N, R1P, and R2P have strong values so that the current which flows through the resistive bridges is as low as possible. The aim is to approximately distribute the voltage difference between terminal 9 (output voltage $V_{OUT}$) and the respective sources of transistors N42 and P42, to obtain identical drain-source voltages $V_{DSN}$ and $V_{DSP}$ for transistors N41 and N42 on the one hand and for transistors P41 and P42 on the other hand.

On the low portion side, drain-source voltage $V_{DSN42}$ of transistor N42 may be written as:

$$VDSN42 = VGSN42 + VR2N - VGSN41,$$

where $V_{R2N}$ is the voltage drop across resistor R2N, and $V_{GSN41}$ and $V_{GSN42}$ are the respective gate-source voltages of transistors N41 and N42.

On the other hand, drain-source voltage $V_{DSN41}$ of transistor N41 may be written as:

$$VDSN41 = VR1N + VGSN41,$$

where $V_{R1N}$ is the voltage drop across resistor R1.

The value of resistor R1N will thus be chosen to be slightly lower than the value of resistor R2N so that gate voltage $V_{GN41}$ of transistor N41 is approximately median between the level of output voltage $V_{OUT}$ and gate voltage $V_{GN42}$ of transistor N42.

The same line of argument applies in the high portion (P-channel transistor).

In the example where power supply voltage $V_2$ is between 2 and 3 times greater than voltage $V_1$ (and thus than the voltage that the low-voltage transistors can stand), dividing the output voltage by 2 is sufficient.

According to another example where voltage $V_2$ would be from 3 to 4 times greater than voltage $V_1$ (for example, a voltage $V_2$ on the order of 12 volts for a voltage $V_1$ on the order of 3.3 volts), two N-channel transistors in series between terminal 9 and transistor N42 and a dividing bridge of three resistors in series, having their respective junction points driving the gates of these two transistors are provided. Thus, each of these transistors only sees one third of the output deviation thereacross.

It could have been envisaged to use a usual cascode assembly of N-channel transistors between terminal 9 and transistor N25. However, this would lead to use a larger number of series transistors (at least 6 for an 8-volt voltage) with the risk of distortion problems for signals of large amplitudes.

Figure 5A:
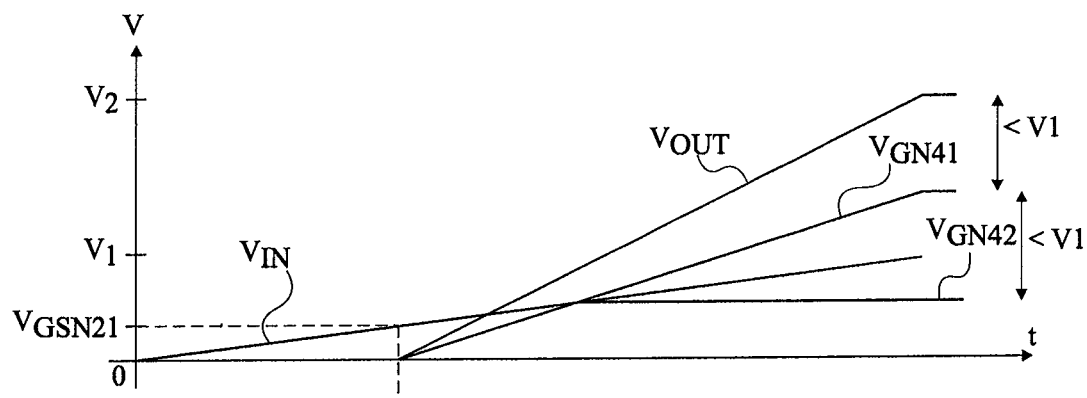
FIGS. 5A and 5B illustrate the operation of the output stage of FIG. 4.
Figure 5B:
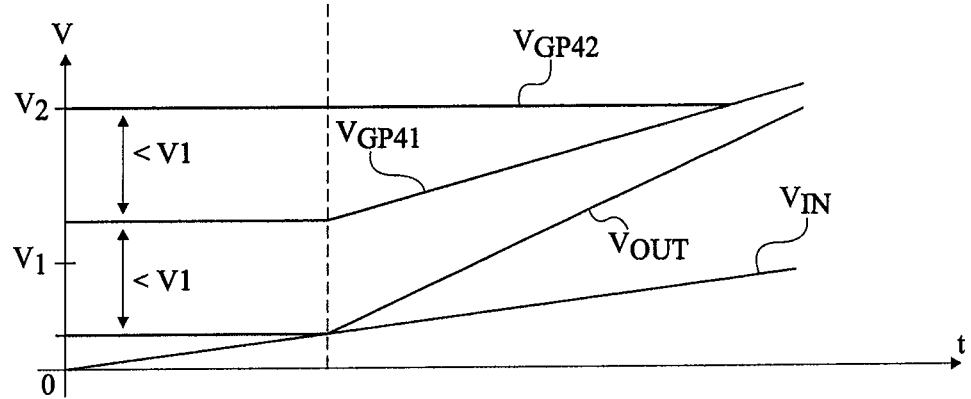

FIGS. 5A and 5B are timing diagrams illustrating the operation of the output stage of FIG. 2. FIG. 5A shows the values taken by voltages $V_{GN42}$, $V_{GN41}$, and $V_{OUT}$. FIG. 5B shows the values taken by voltages $V_{GP42}$, $V_{GP41}$ representing the respective voltages of the gates of transistors P41 and P42 and voltage $V_{OUT}$. To clarify the discussion, a signal $V_{IN}$ in the form of a ramp between ground 0 and voltage level $V_1$ is assumed. It should however be reminded that in practice, the signal is a variable analog signal (for example, a sinusoidal or pseudo-sinusoidal signal).

As illustrated in FIG. 5A, voltages $V_{GN42}$, $V_{GN41}$, and $V_{OUT}$ start increasing from the time when voltage $V_{IN}$ reaches a sufficient level linked to the input stage structure, that is, when level V+ becomes greater than level V−. In the example of input stage illustrated in FIG. 2, considering that the amplifier is looped back, this condition is achieved when level V− reaches the value of output voltage Vout divided by gain k of the output stage. This gain corresponds to the product of the on-state series resistance (RdsON) of transistor N25 by current I. It should be noted that FIG. 5 is a theoretical representation. In practice, level $V_{IN}$ can never be below this threshold, except when the amplifier is off. From this threshold, voltages $V_{GN41}$ and $V_{OUT}$ increase linearly (proportionally to voltage $V_{IN}$) with an amplification ratio set by the dimensions of the transistors and their biasing. As soon as level $V_{IN}$ reaches a value corresponding to a level set by the biasing of transistor N42 (twice the gate-source voltage−2$V_{GS}$), voltage $V_{GN42}$ is stable at this level.

Taking level $V_{GN42}$ as a reference, voltage $V_{GN41}$ approximately corresponds to half voltage $V_{OUT}$ as soon as voltage $V_{GN42}$ is stable.

To simplify the representation of FIG. 5A, voltage drops with respect to positive power supply level $V_1$ and $V_2$ have not been taken into account (it being a theoretical drawing). It can be seen that the difference between levels $V_{GN42}$ and $V_{GN41}$, and that between levels $V_{GN41}$ and $V_{OUT}$, always remains smaller than voltage $V_1$, that is, the corresponding transistors never see a voltage greater than voltage $V_1$.

FIG. 5B shows the same type of shape on the high output stage portion side. It can be seen that the differences between levels $V_{GP42}$ and $V_{GNP1}$ and between levels $V_{GP41}$ and $V_{OUT}$ always remains smaller than voltage $V_1$, voltage $V_{GP41}$ approximately corresponding to half voltage $V_{OUT}$ while voltage $V_{GP42}$ is stable.

Figure 6:
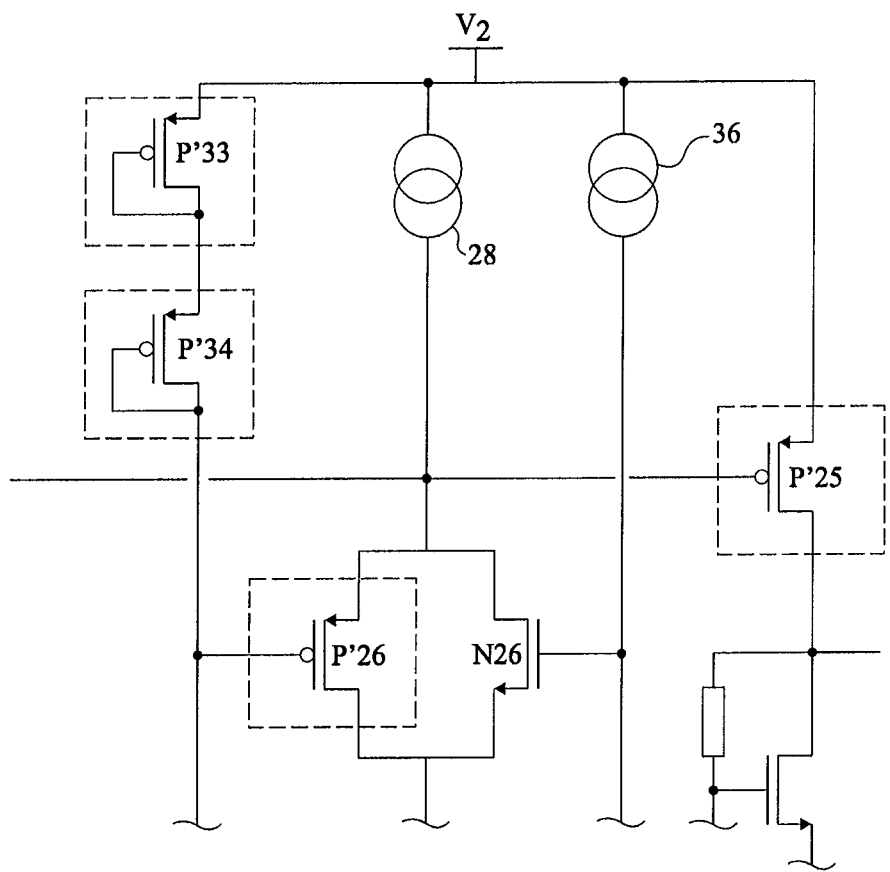
FIG. 6 partially shows a variation of the output stage of FIG. 4.

FIG. 6 partially shows another embodiment of the output stage. The low portion is not modified with respect to FIG. 4 and is not shown.

On the high output stage portion side (between terminal 8 and terminal 9), the assembly of transistors P25, P41, and P42 and of resistors R1P and R2P is replaced with a single P-channel MOS transistor P'25 of DRIFT type. A DRIFT-type transistor is a high-voltage transistor made in a lower-voltage technology, that is, capable of standing a voltage greater than the breakdown voltage of the other transistors. For example, in a 3.3-volt technology ($V_1$), P-channel DRIFT transistors stand approximately 6.5 volts. In the assembly of FIG. 6, transistors P'26, P'33, and P'34 also are DRIFT transistors. If voltage $V_2$ is not too high with respect to voltage $V_1$ (for example, 8 volts with respect to 3.3 volts), one DRIFT transistor is enough.

It could have been envisaged to use a high-voltage N-channel transistor (N-channel DMOS) in the low portion of the amplifier. However, such a transistor has its bulk connected to the substrate, and thus to ground 7. Accordingly, transistor N25 would be cascode-connected and would approximately be submitted to the voltage level minus a gate-source voltage. In the high portion, a P-channel DRIFT transistor has its bulk connected to its source, which makes the assembly of FIG. 6 possible.

In the assembly of FIG. 4, each transistor has its bulk connected to its source.

It is now possible to integrate, within a same circuit, circuits of low-voltage audio processing and amplification under a greater voltage by using the low-voltage circuits technology. The above-described embodiments show that such an integration can be performed without generating any distortion in the signal and with an acceptable surface area increase. This surface area increase is however negligible as compared with the surface area required on an electronic board by two separate circuits. Further, this enables to decrease the cost.

Various embodiments have been described, various alterations and modifications will occur to those skilled in the art. In particular, capacitive stabilization elements are generally integrated to the assembly. Further, the dimensions to be given to the transistors depend on the output currents set by the application. Similarly, those skilled in the art will easily determine the resistive and capacitive elements based on the functional indications given hereinabove and on the application.

Moreover, although the present disclosure has been described in relation with an example of audio amplifier, it more generally applies as soon as similar problems are posed, for example, for the amplification of an analog signal the low-voltage elements and the high-voltage elements are desired to be integrated within a same circuit in the low-voltage technology.

Finally, although the present disclosure has been described in relation with power supply voltages positive with respect to ground, it transposes to an application where the signal to be amplified is negative with respect to ground. The output stage structure is kept identical by applying the ground on terminal 8 and the negative voltage on terminal 7. The input stage structure is adapted correspondingly. The transformation of such a differential input stage is within the abilities of those skilled in the art.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An output stage for a class-AB amplifier, comprising:
   first and second supply terminals;
   an output terminal;
   first and second input terminals;
   a first transistor of a first channel type coupled between the first supply terminal and the output terminal, the first transistor having a gate coupled to the first input terminal;
   a first resistive dividing bridge having first and second resistances coupled to each other at a midpoint;
   second, third, and fourth transistors of a second channel type coupled in series between said output terminal and the second supply terminal and having respective gates, the gate of the second transistor being coupled to the second input terminal of the output stage, the gate of the third transistor being coupled to the midpoint of the first resistive dividing bridge which is coupled between said output terminal and the gate of the fourth transistor, and the gate of the fourth transistor being configured to be biased to a fixed voltage;
   first and second current sources; and
   a differential stage formed of two transistors in parallel, respectively of the first channel type and of the second channel type, the gate of the first transistor being coupled to a first node between the first current source and the differential stage and the gate of the second transistor being coupled to a second node between the second current source and the differential stage.

2. The output stage of claim 1, comprising:
   a third current source; and
   two diode-assembled transistors of the second channel type coupled to the third current source at a third node that is coupled to the gate of the fourth transistor.

3. The output stage of claim 1, wherein said first transistor is a DRIFT-type transistor.

4. The output stage of claim 1, comprising:
   a second resistive dividing bridge having first and second resistances coupled to each other at a midpoint;
   fifth and sixth transistors of the first channel type coupled in series with the first transistor between the output terminal and the first supply terminal and having respective gates, the gate of the fifth transistor being coupled to the midpoint of the second resistive dividing bridge, which is coupled between said output terminal and the gate of the sixth transistor, and the gate of the sixth transistor being configured to be biased to a fixed voltage.

5. The output stage of claim 4, comprising:
   a third current source; and
   first and second diode-assembled transistors of the first channel type coupled to the third current source at a third node that is coupled to the gate of the sixth transistor.

6. A class-AB amplifier, comprising:
   an input stage; and
   output stage coupled to the input stage and including:
      first and second supply terminals;

an output terminal;
first and second input terminals;
a first transistor of a first channel type coupled between the first supply terminal and the output terminal, the first transistor having a gate coupled to the first input terminal;
a first resistive dividing bridge having first and second resistances coupled to each other at a midpoint;
second, third, and fourth transistors of a second channel type coupled in series between said output terminal and the second supply terminal and having respective gates, the gate of the second transistor being coupled to the second input terminal of the output stage, the gate of the third transistor being coupled to the midpoint of the first resistive dividing bridge which is coupled between said output terminal and the gate of the fourth transistor, and the gate of the fourth transistor being configured to be biased to a fixed voltage;
first and second current sources; and
a differential stage formed of two transistors in parallel, respectively of the first channel type and of the second channel type, the gate of the first transistor being coupled to a first node between the first current source and the differential stage and the gate of the second transistor being coupled to a second node between the second current source and the differential stage.

7. The class-AB amplifier of claim 6, comprising:
a third current source; and
two diode-assembled transistors of the second channel type coupled to the third current source at a third node that is coupled to the gate of the fourth transistor.

8. The class-AB amplifier of claim 6, wherein said first transistor is a DRIFT-type transistor.

9. The class-AB amplifier of claim 6, wherein the output stage includes:
a second resistive dividing bridge having first and second resistances coupled to each other at a midpoint;
fifth and sixth transistors of the first channel type coupled in series with the first transistor between the output terminal and the first supply terminal and having respective gates, the gate of the fifth transistor being coupled to the midpoint of the second resistive dividing bridge, which is coupled between said output terminal and the gate of the sixth transistor, and the gate of the sixth transistor being configured to be biased to a fixed voltage.

10. The class-AB amplifier of claim 9, wherein the output stage includes:
a third current source; and
first and second diode-assembled transistors of the first channel type coupled to the third current source at a third node that is coupled to the gate of the sixth transistor.

11. The class-AB amplifier of claim 6, wherein the input stage includes:
a third supply terminal configured to receive a first supply voltage, wherein the first supply terminal is configured to receive a second supply voltage that is greater than the first supply voltage; and
a differential stage coupled between the second and third supply terminals and having an output coupled to the second input of the output stage.

12. A system, comprising:
an audio signal processor; and
an amplifier coupled to the audio signal processor and including an output stage that includes:
first and second supply terminals;
an output terminal;
first and second input terminals;
a first transistor of a first channel type coupled between the first supply terminal and the output terminal, the first transistor having a gate connected to the first input terminal;
a first resistive dividing bridge having first and second resistances coupled to each other at a midpoint;
second, third, and fourth transistors of a second channel type coupled in series between said output terminal and the second supply terminal and having respective gates, the gate of the second transistor being coupled to the second input terminal of the output stage, the gate of the third transistor being coupled to the midpoint of the first resistive dividing bridge which is coupled between said output terminal and the gate of the fourth transistor, and the gate of the fourth transistor being configured to be biased to a fixed voltage;
first and second current sources; and
a differential stage formed of two transistors in parallel, respectively of the first channel type and of the second channel type, the gate of the first transistor being coupled to a first node between the first current source and the differential stage and the gate of the second transistor being coupled to a second node between the second current source and the differential stage.

13. The system of claim 12, wherein the output stage includes:
a third current source; and
two diode-assembled transistors of the second channel type coupled to the third current source at a third node that is coupled to the gate of the fourth transistor.

14. The system of claim 12, wherein said first transistor is a DRIFT-type transistor.

15. The system of claim 12, wherein the output stage includes:
a second resistive dividing bridge having first and second resistances coupled to each other at a midpoint;
fifth and sixth transistors of the first channel type coupled in series with the first transistor between the output terminal and the first supply terminal and having respective gates, the gate of the fifth transistor being coupled to the midpoint of the second resistive dividing bridge, which is coupled between said output terminal and the gate of the sixth transistor, and the gate of the sixth transistor being configured to be biased to a fixed voltage.

16. The system of claim 15, wherein the output stage includes:
a third current source; and
first and second diode-assembled transistors of the first channel type coupled to the third current source at a third node that is coupled to the gate of the sixth transistor.

17. The system of claim 12, wherein the amplifier includes:
a third supply terminal configured to receive a first supply voltage, wherein the first supply terminal is configured to receive a second supply voltage that is greater than the first supply voltage; and
an input differential stage coupled between the second and third supply terminals and having an output coupled to the second input of the output stage.

18. An output stage for a class-AB amplifier, comprising:
first and second supply terminals;
an output terminal;
first and second input terminals configured to receive first and second input signals respectively;
a first transistor of a first channel type coupled between the first supply terminal and the output terminal, the first transistor having a gate configured to receive the first input signal to the first input terminal;

a first resistive dividing bridge having first and second resistances coupled to each other at a midpoint;

second, third, and fourth transistors of a second channel type coupled in series between said output terminal and the second supply terminal and having respective gates, the gate of the second transistor being coupled to the second input terminal of the output stage, the gate of the third transistor being coupled to the midpoint of the first resistive dividing bridge which is coupled between said output terminal and the gate of the fourth transistor; and a first bias circuit configured to bias the gate of the fourth transistor to a fixed voltage.

19. The output stage of claim 18, wherein the bias circuit includes:

a first current source; and two diode-assembled transistors of the second channel type coupled to the first current source at a first node that is coupled to the gate of the fourth transistor.

20. The output stage of claim 18, comprising:

a second resistive dividing bridge having first and second resistances coupled to each other at a midpoint;

fifth and sixth transistors of the first channel type coupled in series with the first transistor between the output terminal and the first supply terminal and having respective gates, the gate of the fifth transistor being coupled to the midpoint of the second resistive dividing bridge, which is coupled between said output terminal and the gate of the sixth transistor, and the gate of the sixth transistor being configured to be biased to a fixed voltage; and a second bias circuit configured to bias the gate of the sixth transistor to a fixed voltage.

21. The output stage of claim 20, wherein the second bias circuit includes:

a second current source; and first and second diode-assembled transistors of the first channel type coupled to the third current source at a third node that is coupled to the gate of the sixth transistor.

22. The output stage of claim 20, comprising:

a differential stage formed of seventh and eighth transistors in parallel, respectively of the first channel type and of the second channel type, the gate of the first transistor being coupled to a first node between the first supply terminal and the differential stage and the gate of the second transistor being coupled to a second node between the second supply and the differential stage, the seventh transistor having a gate coupled to the gate of the fourth transistor and the eighth transistor having a gate coupled to the gate of the sixth transistor.

* * * * *